United States Patent
Hidaka

(10) Patent No.: US 11,735,428 B2
(45) Date of Patent: Aug. 22, 2023

(54) SUBSTRATE PROCESSING METHOD AND SUBSTRATE PROCESSING APPARATUS

(71) Applicant: Tokyo Electron Limited, Tokyo (JP)

(72) Inventor: Shoichiro Hidaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/813,983

(22) Filed: Jul. 21, 2022

(65) Prior Publication Data

US 2022/0359218 A1 Nov. 10, 2022

Related U.S. Application Data

(62) Division of application No. 17/089,802, filed on Nov. 5, 2020, now Pat. No. 11,430,662.

(30) Foreign Application Priority Data

Nov. 6, 2019 (JP) ................................. 2019-201551

(51) Int. Cl.
| | |
|---|---|
| H01J 37/32 | (2006.01) |
| H01L 21/306 | (2006.01) |
| H01L 21/02 | (2006.01) |
| B08B 3/04 | (2006.01) |
| B05D 3/10 | (2006.01) |

(52) U.S. Cl.
CPC ........ *H01L 21/30604* (2013.01); *B05D 3/107* (2013.01); *B08B 3/04* (2013.01); *H01J 37/32449* (2013.01); *H01J 37/32715* (2013.01); *H01L 21/02063* (2013.01)

(58) Field of Classification Search
None
See application file for complete search history.

(56) References Cited

U.S. PATENT DOCUMENTS

| | | |
|---|---|---|
| 8,883,030 B2 | 11/2014 | Miyagi et al. |
| 9,768,042 B2 | 9/2017 | Wakita et al. |
| 9,899,229 B2 | 2/2018 | Hinode et al. |
| 10,770,284 B2 | 9/2020 | Yonekawa et al. |
| 10,861,718 B2 | 12/2020 | Negoro et al. |
| 2014/0080312 A1 | 3/2014 | Iwamoto et al. |
| 2017/0345682 A1 | 11/2017 | Otsuji |
| 2020/0185261 A1 | 6/2020 | Sekiguchi |

FOREIGN PATENT DOCUMENTS

| | | |
|---|---|---|
| JP | 2013-074196 A | 4/2013 |
| JP | 2014-209605 A | 11/2014 |
| JP | 2015-220369 A | 12/2015 |
| JP | 2019-012802 A | 1/2019 |
| JP | 2019-125660 A | 7/2019 |

*Primary Examiner* — Shamim Ahmed
(74) *Attorney, Agent, or Firm* — Pearne & Gordon LLP

(57) ABSTRACT

A substrate processing method includes forming a liquid film of an alkaline processing liquid on a substrate by supplying the alkaline processing liquid having a reduced oxygen concentration onto the substrate; and etching the substrate by rotating the substrate while supplying the alkaline processing liquid in a state that the liquid film having a given thickness is formed on the substrate.

3 Claims, 9 Drawing Sheets

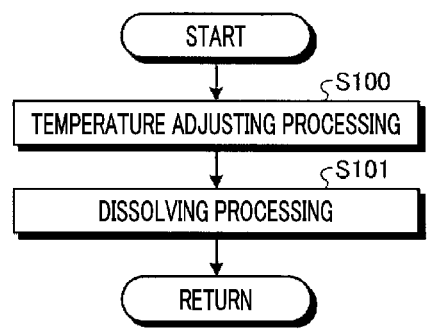
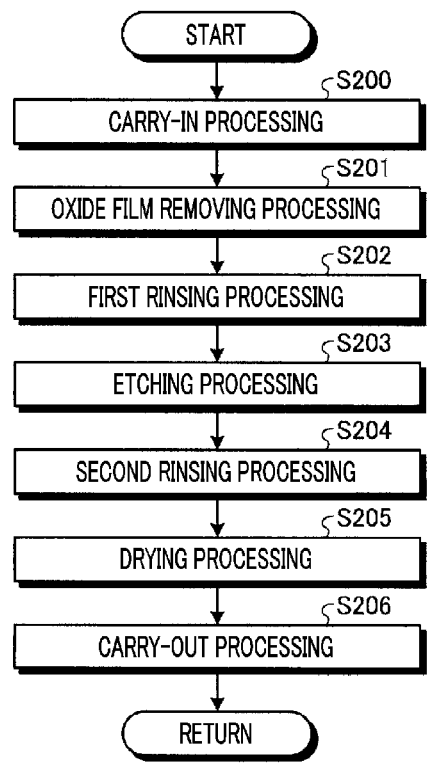

SUBSTRATE PROCESSING METHOD AND SUBSTRATE PROCESSING APPARATUS

CROSS-REFERENCE TO RELATED APPLICATION

This is a divisional application of U.S. patent application Ser. No. 17/089,802, filed on Nov. 5, 2020, which claims the benefit of Japanese Patent Application No. 2019-201551 filed on Nov. 6, 2019, the entire disclosures of which are incorporated herein by reference.

TECHNICAL FIELD

The various aspects and embodiments described herein pertain generally to a substrate processing method and a substrate processing apparatus.

BACKGROUND

Patent Document 1 describes a technique of performing an etching processing by supplying an alkaline processing liquid including dissolved oxygen onto a substrate.

Patent Document 1: Japanese Patent Laid-open Publication No. 2019-012802

SUMMARY

In an exemplary embodiment, a substrate processing method includes forming a liquid film of an alkaline processing liquid on a substrate by supplying the alkaline processing liquid having a reduced oxygen concentration onto the substrate; and etching the substrate by rotating the substrate while supplying the alkaline processing liquid in a state that the liquid film having a given thickness is formed on the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4 is a flowchart for describing an etching liquid producing processing according to the first exemplary embodiment;

FIG. 5 is a flowchart for describing a substrate processing according to the first exemplary embodiment;

DETAILED DESCRIPTION

Figure 1:
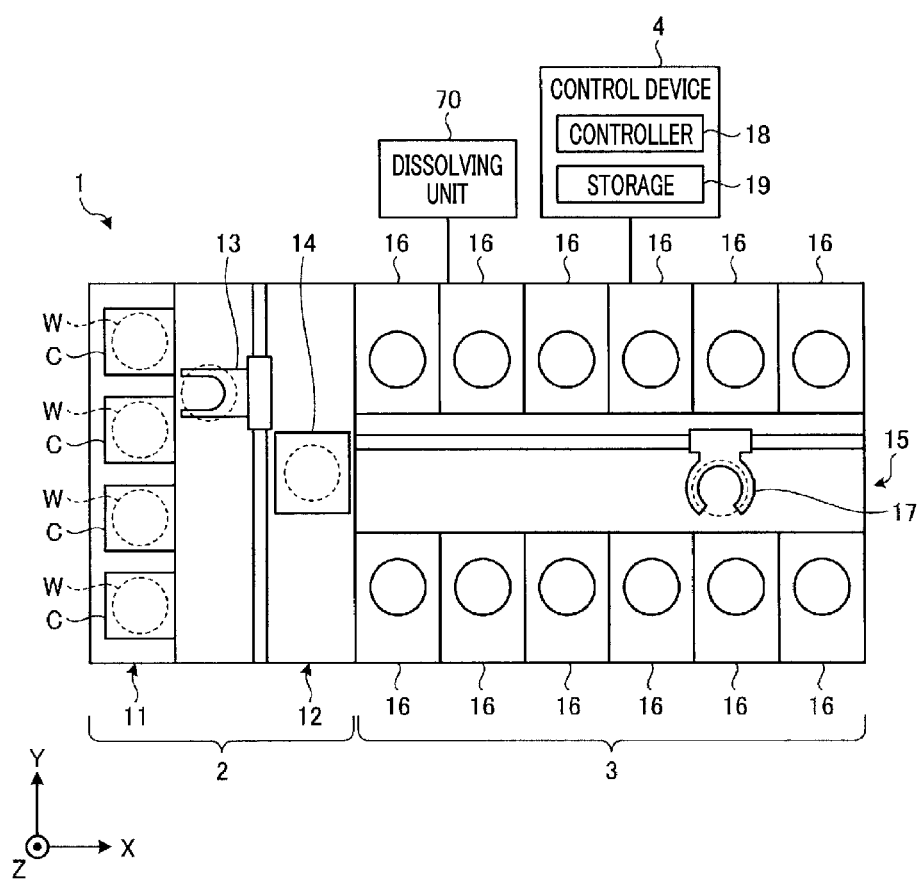
FIG. 1 is a diagram illustrating a schematic configuration of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing method and a substrate processing apparatus according to the present disclosure will be described in detail. However, it should be noted that the substrate processing method and the substrate processing apparatus of the present disclosure is not limited by the following exemplary embodiments.

First Exemplary Embodiment

<Outline of Substrate Processing System>

Referring to FIG. 1, a schematic configuration of a substrate processing system 1 according to a first exemplary embodiment will be explained. FIG. 1 is a diagram illustrating the schematic configuration of the substrate processing system 1 according to the first exemplary embodiment. In the following, in order to clarify positional relationships, the X-axis, Y-axis and Z-axis which are orthogonal to each other will be defined, and the positive Z-axis direction will be regarded as a vertically upward direction.

As illustrated in FIG. 1, the substrate processing system 1 includes a carry-in/out station 2 and a processing station 3 (an example of a substrate processing apparatus). The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers W in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16 (an example of a processing unit). The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

Each of the processing units 16 is configured to perform a predetermined substrate processing on the wafer W transferred by the substrate transfer device 17. A dissolving unit 70 configured to dissolve an inert gas in an alkaline aqueous solution L (an example of an alkaline processing liquid) and supply the alkaline aqueous solution L including the dissolved inert gas to the processing unit 16 is connected to the processing unit 16. A configuration example of the processing unit 16 and the dissolving unit 70 will be elaborated later.

Further, the substrate processing system 1 is provided with a control device 4. The control device 4 is, for example, a computer, and includes a controller 18 and a storage 19.

The storage 19 stores therein a program that controls various processings performed in the substrate processing system 1. The storage 19 may be implemented by a semiconductor memory device such as a RAM (Random Access Memory) or a flash memory, or a storage device such as a hard disk or an optical disk.

The controller 18 controls operations of the substrate processing system 1 by reading and executing the program stored in the storage 19. Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then carried out from the processing unit 16 and placed on the delivery unit 14 by the substrate transfer device 17. The processed wafer W placed on the delivery unit 14 is then returned to the carrier C of the carrier placing section 11 by the substrate transfer device 13.

<Processing Unit and Mixer>

Figure 2:
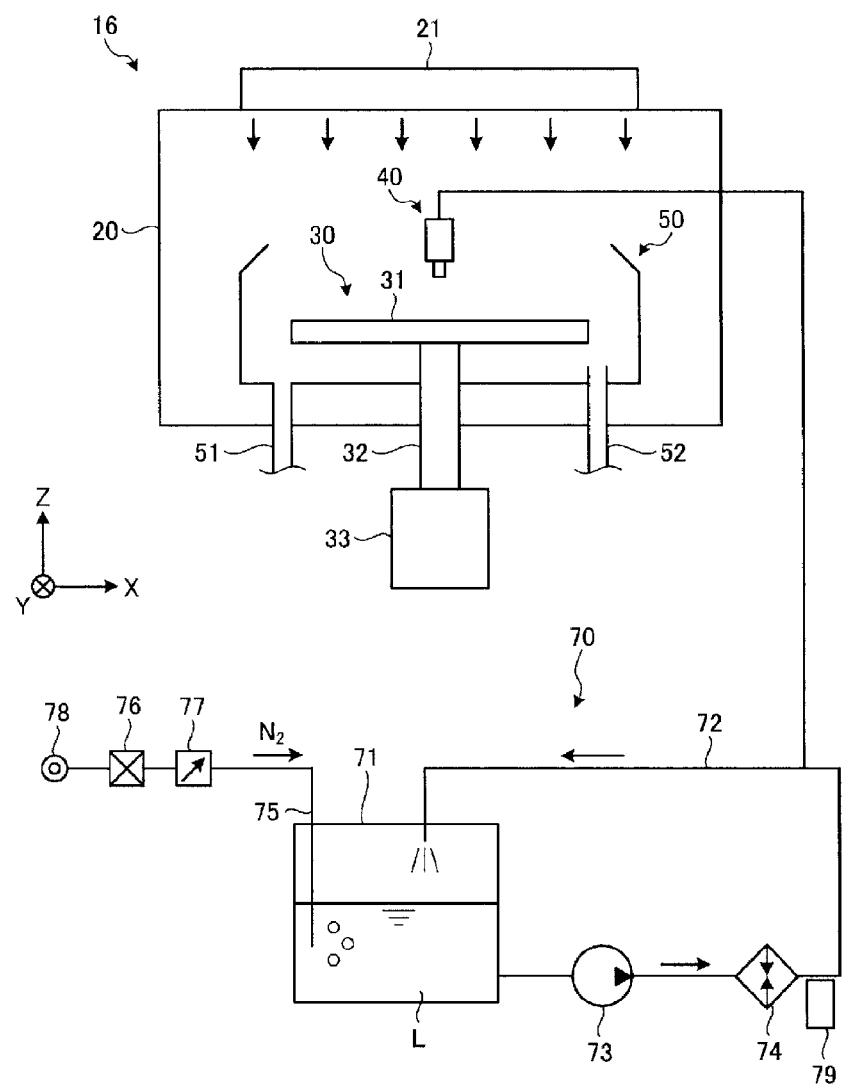
FIG. 2 is a schematic diagram illustrating a configuration of a processing unit and a mixer according to the first exemplary embodiment.

Now, the processing unit 16 and the dissolving unit 70 will be explained with reference to FIG. 2. FIG. 2 is a schematic diagram illustrating the configuration of the processing unit 16 and the dissolving unit 70 according to the first exemplary embodiment. As depicted in FIG. 2, the processing unit 16 includes a chamber 20, a substrate holding mechanism 30, a processing fluid supply 40, and a recovery cup 50.

The chamber 20 accommodates therein the substrate holding mechanism 30, the processing fluid supply 40 and the recovery cup 50. A FFU (Fan Filter Unit) 21 is provided at a ceiling of the chamber 20. The FFU 21 creates a downflow within the chamber 20.

The substrate holding mechanism 30 is equipped with a holder 31, a supporting column 32 and a driving unit 33. The holder 31 holds the wafer W horizontally. The supporting column 32 is a vertically extending member. A base end portion of this supporting column 32 is rotatably supported by the driving unit 33, and a leading end portion thereof sustains the holder 31 thereon horizontally. The driving unit 33 is configured to rotate the supporting column 32 around the vertical axis.

In the substrate holding mechanism 30, by rotating the supporting column 32 by using the driver 33, the holder 31 supported on the supporting column 32 is rotated, so that the wafer W held by the holder 31 is rotated.

The processing fluid supply 40 is configured to supply a processing fluid onto the wafer W. Further, the processing fluid supply 40 is connected to the dissolving unit 70.

The recovery cup 50 is disposed to surround the holder 31, and is configured to collect the processing liquid scattered from the wafer W when the holder 31 is rotated. A drain port 51 is formed at a bottom of the recovery cup 50, and the processing liquid collected by the recovery cup 50 is drained from the drain port 51 to the outside of the processing unit 16. Further, an exhaust port 52 is formed at the bottom of the recovery cup 50 to exhaust a gas supplied from the FFU 21 to the outside of the processing unit 16.

The dissolving unit 70 is equipped with a chemical liquid container 71, a circulation line 72, a pump 73, a temperature controller 74, and a bubbling line 75.

The chemical liquid container 71 stores therein the alkaline aqueous solution (the example of the alkaline processing liquid) L used as an etching liquid. The alkaline aqueous solution L includes at least one of, by way of non-limiting example, TMAH (tetramethyl ammonium hydroxide), a choline aqueous solution, a KOH (potassium hydroxide) aqueous solution and ammonia water.

The chemical liquid container 71 is connected with the circulation line 72 through which the alkaline aqueous solution L stored in the chemical liquid container 71 is circulated. The circulation line 72 is connected to the aforementioned processing fluid supply 40.

The circulation line 72 is equipped with the pump 73 and the temperature controller 74. The alkaline aqueous solution L adjusted to a preset temperature by the temperature controller 74 is circulated through the circulation line 72 by the pump 73. The preset temperature is a previously set temperature and may be, e.g., about 25° C. The preset temperature may be higher than 25° C., for example, about 80° C.

Further, the circulation line 72 is equipped with a sensor 79 configured to measure an oxygen concentration in the alkaline aqueous solution L.

The chemical liquid container 71 is also connected with the bubbling line 75 configured to perform bubbling of an inert gas into the alkaline aqueous solution L stored in the chemical liquid container 71. Here, the inert gas may be, by way of example, but not limitation, nitrogen.

The bubbling line 75 is equipped with a valve 76 and a flow rate controller 77. The bubbling line 75 supplies the inert gas from an inert gas source 78 into the chemical liquid container 71 via the valve 76 and the flow rate controller 77.

The inert gas supplied from the bubbling line 75 is dissolved in the alkaline aqueous solution L. That is, the dissolving unit 70 dissolves the inert gas in the alkaline aqueous solution L. The oxygen concentration of the alkaline aqueous solution L is reduced as the inert gas is dissolved therein.

Figure 3:
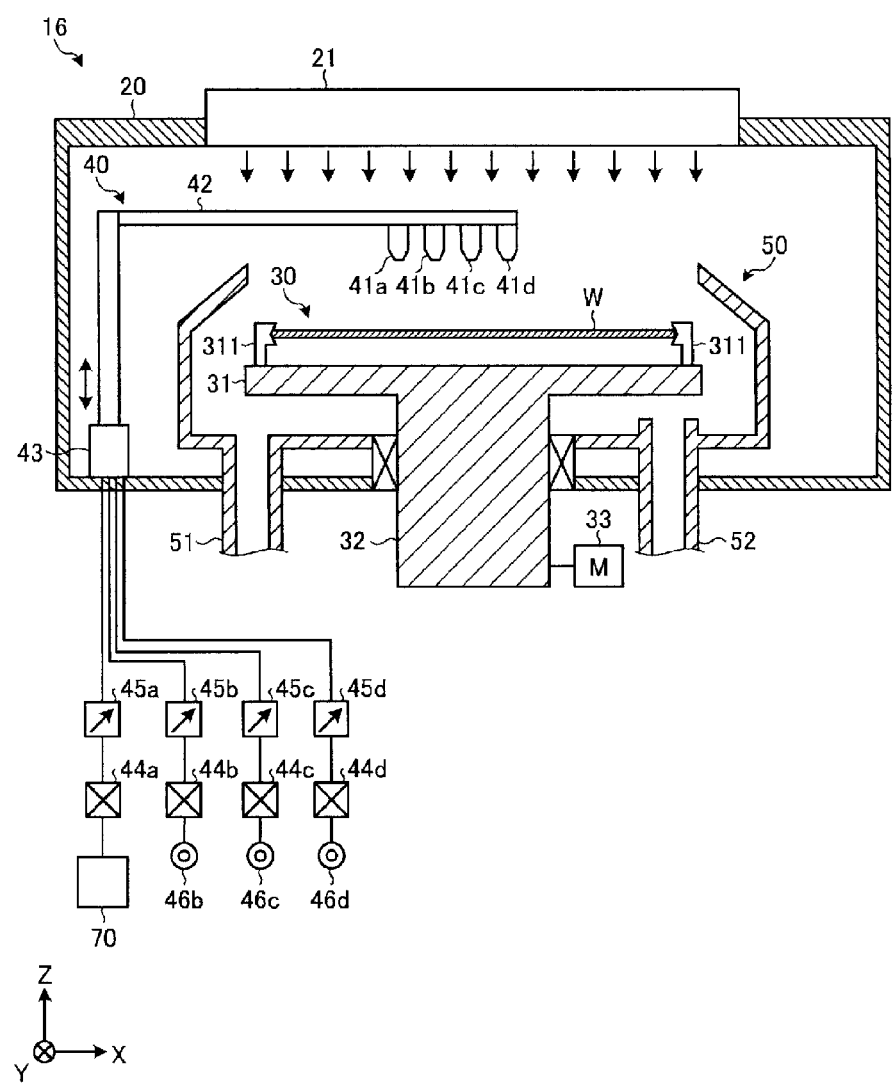
FIG. 3 is a schematic diagram illustrating a specific configuration example of the processing unit according to the first exemplary embodiment.

Now, a specific configuration example of the processing unit 16 will be explained with reference to FIG. 3. FIG. 3 is a schematic diagram illustrating the specific configuration example of the processing unit 16 according to the first exemplary embodiment.

As depicted in FIG. 3, a holding member 311 configured to hold the wafer W from a lateral side thereof is provided on a top surface of the holder 31 of the substrate holding mechanism 30. The wafer W is horizontally held by the holding member 311 while being slightly spaced apart from the top surface of the holder 31. The wafer W is held on the holder 31 such that a front surface thereof on which an etching processing is to be performed faces upwards.

The processing fluid supply 40 includes a multiple number of (here, four) nozzles 41a to 41d; an arm 42 configured to support the nozzles 41a to 41d horizontally; and a rotating/elevating mechanism 43 configured to rotate the arm 42 and move it up and down.

The nozzle 41a is connected to the aforementioned dissolving unit 70 via a valve 44a and a flow rate controller 45a. The nozzle 41b is connected to a DIW source 46b via a valve 44b and a flow rate controller 45b. DIW (Deionized Water) is used for, for example, a rinsing processing.

The nozzle 41c is connected to a DHF source 46c via a valve 44c and a flow rate controller 45c. The DHF (Diluted HydroFluoric acid) is used for, for example, an oxide film removing processing. The nozzle 41d is connected to an IPA source 46d via a valve 44d and a flow rate controller 45d. IPA (IsoPropyl Alcohol) is used for, for example, a drying processing.

The nozzle 41a discharges the alkaline aqueous solution L supplied from the dissolving unit 70. The nozzle 41b discharges the DIW supplied from the DIW source 46b. The nozzle 41c discharges the DHF supplied from the DHF source 46c. The nozzle 41d supplies the IPA supplied from the IPA source 46d.

The processing unit 16 (the example of the processing unit) performs the etching processing on the wafer W by supplying the alkaline aqueous solution L (alkaline processing liquid) including the inert gas onto the wafer W (an example of a substrate). To elaborate, the processing unit 16 rotates the wafer W while supplying the alkaline aqueous solution L including the inert gas onto the wafer W in the state that a liquid film of the alkaline aqueous solution L including the inert gas is formed to have a preset thickness (a given thickness). Details of the etching processing will be elaborated later.

<Substrate Processing>

Now, an etching liquid producing processing according to the first exemplary embodiment will be described with reference to a flowchart of FIG. 4. FIG. 4 is a flowchart for describing the etching liquid producing processing according to the first exemplary embodiment.

The control device 4 performs a temperature adjusting processing (S100). The control device 4 drives the pump 73 and thus circulates the alkaline aqueous solution L in the circulation line 72. Further, the control device 4 adjusts a temperature of the alkaline aqueous solution L to the preset temperature by the temperature controller 74.

The control device 4 performs a dissolving processing (S101). The control device 4 supplies the inert gas into the alkaline aqueous solution L (the example of the alkaline processing liquid). To elaborate, the control device 4 supplies the inert gas into the alkaline aqueous solution L within the chemical liquid container 71 from the bubbling line 75, and reduces the oxygen concentration of the alkaline aqueous solution L by dissolving the inert gas in the alkaline aqueous solution L. The control device 4 controls the sensor 79 to measure the oxygen concentration of the alkaline aqueous solution L being circulated in the circulation line 72, and supplies the inert gas from the bubbling line 75 such that the oxygen concentration of the alkaline aqueous solution L reaches equal to or less than a predetermined concentration. The predetermined concentration is a previously set concentration, and specifically may be 0.1 ppm. That is, the oxygen concentration of the alkaline aqueous solution L is equal to or less than 0.1 ppm.

Further, the temperature adjusting processing and the dissolving processing may be performed as a single processing. Further, the temperature adjusting processing and the dissolving processing may be included in a substrate processing to be described below.

Now, the substrate processing according to the first exemplary embodiment will be described with reference to a flowchart of FIG. 5. FIG. 5 is a flowchart illustrating the substrate processing according to the first exemplary embodiment.

The control device 4 performs a carry-in processing (S200). The control device 4 carries the wafer W into the chamber 20 of the processing unit 16 by the substrate transfer device 17. The wafer W is held by the holding member 311 with the front surface to be subjected to the etching processing facing upwards. Then, the control device 4 controls the driving unit 33 to rotate the substrate holding mechanism 30. That is, the control device 4 rotates the wafer W.

The control device 4 performs an oxide film removing processing (S201). The control device 4 moves the nozzle 41c of the processing fluid supply 40 to a position above a center of the wafer W. The control device 4 supplies the DHF as an etching liquid onto the front surface of the wafer W from the nozzle 41c.

The DHF supplied on the front surface of the wafer W is diffused onto the entire front surface of the wafer W by a centrifugal force which is generated when the wafer W is rotated. As a result, an oxide film formed on the wafer W is removed by the DHF.

The control device 4 performs a first rinsing processing (S202). The control device 4 moves the nozzle 41b of the processing fluid supply 40 to the position above the center of the wafer W. The control device 4 supplies the DIW onto the front surface of the wafer W from the nozzle 41b. The DIW supplied on the front surface of the wafer W replaces the DHF remaining on the front surface of the wafer W.

The control device 4 performs an etching processing (S203). The control device 4 supplies the alkaline aqueous solution L with the reduced oxygen concentration onto the front surface of the wafer W, thus allowing the wafer W to be etched by the alkaline aqueous solution L.

The control device 4 first forms the liquid film of the alkaline aqueous solution L on the front surface of the wafer W by diffusing the alkaline aqueous solution L onto the entire front surface of the wafer W. To elaborate, the control device 4 moves the nozzle 41a of the processing fluid supply 40 to the position above the center of the wafer W. Then, the control device 4 rotates the wafer W at a first predetermined rotation speed while supplying the alkaline aqueous solution L onto the front surface of the wafer W from the nozzle 41a at a first predetermined flow rate. The first predetermined flow rate is a previously set flow rate and may be, e.g., 1.5 L/min. The first predetermined rotation speed is a previously set rotation speed and may be equal to or higher than, e.g., 500 rpm. In the present exemplary embodiment, the first predetermined rotation speed is, for example, 1000 rpm.

The alkaline aqueous solution L supplied on the front surface of the wafer W is diffused onto the entire front surface of the wafer W by the centrifugal force generated when the wafer W is rotated, and forms the liquid film. Further, a time period during which the wafer W is rotated at the first predetermined rotation speed needs to be set to be a time required for the alkaline aqueous solution L to be diffused onto the entire front surface of the wafer W, for example, just a short time of, e.g., 2 seconds.

Subsequently, the control device 4 etches the wafer W in the state that the film thickness of liquid film of the alkaline aqueous solution L formed on the front surface of the wafer W becomes equal to or larger than the preset thickness. To be specific, the control device 4 rotates the wafer W at a second predetermined rotation speed. The preset thickness is a previously set thickness and may be, e.g., equal to or larger than 400 μm. The second predetermined rotation speed is a previously set rotation speed and set to be lower than the first predetermined rotation speed. The second predetermined rotation speed is set to be lower than, e.g., 500 rpm. In the present exemplary embodiment, the second predetermined rotation speed is, for example, larger than 0 rpm and equal to or less than 30 rpm.

The control device 4 etches the wafer W by rotating the wafer W while supplying the alkaline aqueous solution L from the nozzle 41a in the state that the liquid film of the alkaline aqueous solution L is formed to have the preset thickness or larger.

The control device 4 then performs a second rinsing processing (S204). The control device 4 supplies the DIW onto the front surface of the wafer W, the same as in the first rinsing processing.

As the DIW is supplied on the front surface of the wafer W, the alkaline aqueous solution L remaining on the front surface of the wafer W is replaced by the DIW.

The control device 4 then performs a drying processing (S205). The control device 4 moves the nozzle 41d of the processing fluid supply 40 to the position above the center of the wafer W. The control device 4 supplies the IPA from the nozzle 41d onto the front surface of the wafer W while rotating the substrate holding mechanism 30 at a preset rotation speed. After supplying the IPA for a predetermined time period, the control device 4 stops the supply of the IPA and dries the wafer W by spinning.

As the IPA is supplied onto the front surface of the wafer W, the DIW remaining on the front surface of the wafer W is replaced by the IPA. Further, the control device 4 may dry the wafer W by spinning it without supplying the IPA.

The control device 4 then performs a carry-out processing (S206). The control device 4 controls the driving unit 33 to stop the rotation of the wafer W, and then controls the substrate transfer device 17 to carry out the wafer W from the processing unit 16. Upon the completion of the carry-out processing, the series of processes of the substrate processing upon the single sheet of wafer W are completed.

As known in the art, when the etching processing is performed by using the alkaline aqueous solution L, oxygen included in the alkaline aqueous solution L adheres to the wafer W, forming an oxide film F thereon.

Here, a comparative example where the substrate processing according to the first exemplary embodiment is not performed will be explained. In a substrate processing according to the comparative example, an oxygen concentration of the alkaline aqueous solution L is not reduced, and a thickness of a liquid film of the alkaline aqueous solution L is not maintained equal to or larger than the preset thickness. Further, as the downflow is formed within the chamber 20 by the FFU 21, oxygen is dissolved from a surface of the liquid film of the alkaline aqueous solution L, so that the oxygen concentration is increased near the surface of the liquid film of the alkaline aqueous solution L.

Figure 6A:
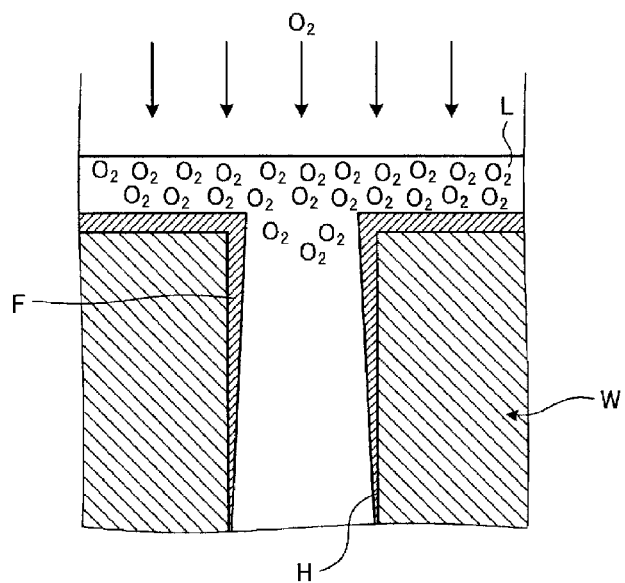
FIG. 6A is a schematic diagram of a hole of a wafer in a substrate processing according to a comparative example.

Therefore, in the substrate processing according to the comparative example, adhesion of the oxygen increases near an opening portion of a hole H of the wafer W, resulting in an increase of a thickness of an oxide film F formed thereat, as shown in FIG. 6A. FIG. 6A is a schematic diagram illustrating the hole H of the wafer W in the substrate processing according to the comparative example.

Further, in the substrate processing according to the comparative example, as the oxygen adheres to the wafer W near the opening portion of the hole H thereof, an oxygen concentration of the alkaline aqueous solution L at a bottom portion of the hole H of the wafer W becomes lower than an oxygen concentration of the alkaline aqueous solution L near the opening portion of the hole H. Accordingly, a thickness of the oxide film F at the bottom portion of the hole H of the wafer W becomes smaller than a thickness of the oxide film F at the opening portion, resulting in an increase of a difference between an etching amount at the opening portion of the hole H of the wafer W and an etching amount at the bottom portion of the hole H of the wafer W. As a result, in the substrate processing according to the comparative example, an etching ratio calculated by dividing the etching amount at the bottom portion of the hole H by the etching amount at the opening portion of the hole H is increased.

In contrast, in the substrate processing according to the first exemplary embodiment, the etching is carried out by the alkaline aqueous solution L including the inert gas dissolved therein and thus having the reduced oxygen concentration. Therefore, in the substrate processing according to the first exemplary embodiment, adhesion of the oxygen to the wafer W near the opening portion of the hole H thereof is suppressed.

Furthermore, the etching is performed by rotating the wafer W while supplying the alkaline aqueous solution L in the state that the thickness of the liquid film of the alkaline aqueous solution L formed on the front surface of the wafer W is maintained equal to or larger than the preset thickness. Accordingly, in the substrate processing according to the first exemplary embodiment, even if the oxygen is dissolved from the surface of the liquid film of the alkaline aqueous solution L, a distance between the oxygen near the surface of the liquid film of the alkaline aqueous solution L and the opening portion of the hole H of the wafer W is lengthened. Thus, in the substrate processing according to the first exemplary embodiment, the adhesion of the oxygen to the wafer near the opening portion of the hole H thereof is suppressed.

Figure 6B:
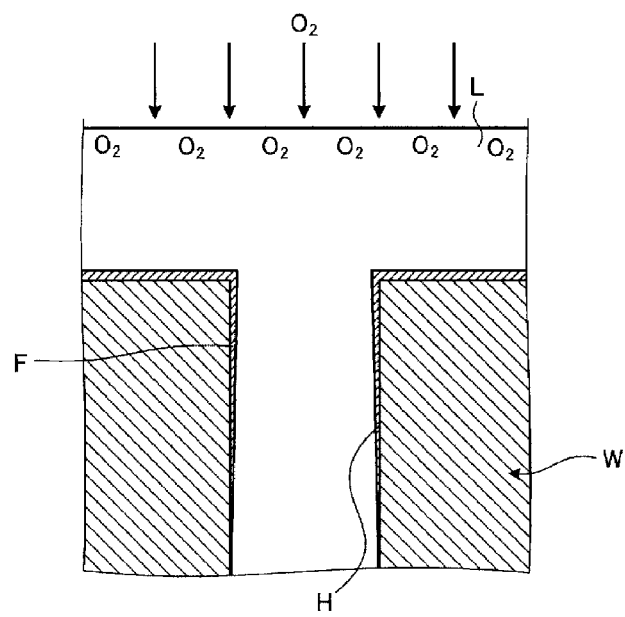
FIG. 6B is a schematic diagram of a hole of a wafer in the substrate processing according to the first exemplary embodiment.

In the substrate processing according to the first exemplary embodiment, the formation of the oxide film F near the opening portion of the hole H of the wafer W is suppressed, as depicted in FIG. 6B. Accordingly, in the substrate processing according to the first exemplary embodiment, the difference between the etching amount at the opening portion of the hole H of the wafer W and the etching amount at the bottom portion of the hole H of the wafer W is reduced. Therefore, in the substrate processing according to the first exemplary embodiment, the etching ratio is reduced. FIG. 6B is a schematic diagram illustrating the hole H of the wafer W in the substrate processing according to the first exemplary embodiment.

Figure 7:
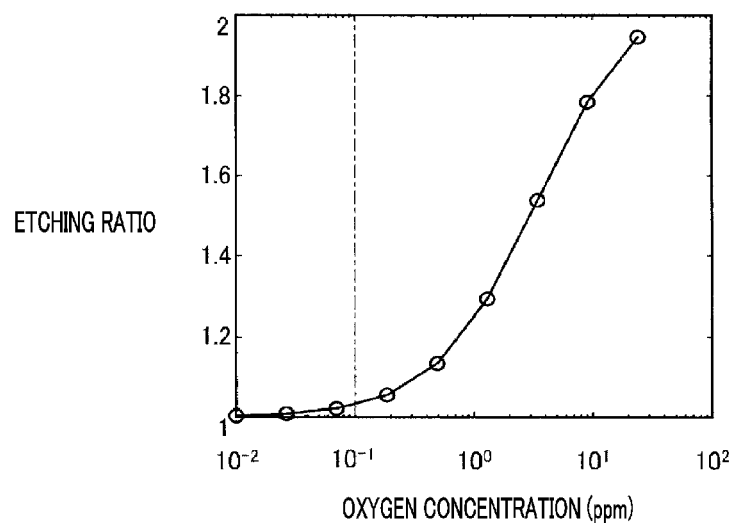
FIG. 7 presents a simulation result in the substrate processing according to the first exemplary embodiment.

Further, FIG. 7 presents a simulation result of the oxygen concentration at the opening portion of the hole H of the wafer W and the etching ratio. FIG. 7 presents the simulation result in the substrate processing according to the first exemplary embodiment. FIG. 7 shows the etching ratio when the oxygen concentration of the alkaline aqueous solution L is varied by dissolving nitrogen in the alkaline aqueous solution L as the inert gas. Further, in the simulation shown in FIG. 7, a rotation speed of the wafer W is 30 rpm.

As illustrated in FIG. 7, if the oxygen concentration at the opening portion of the hole H of the wafer W is reduced, the etching ratio approaches '1.' When the oxygen concentration of the alkaline aqueous solution L is equal to or less than 0.1 ppm, the etching ratio is small and uniformity of the etching amount at the bottom portion and the opening portion of the hole H can be improved. That is, the uniformity of the etching amount in a depth direction of the hole H of the wafer W can be improved.

Further, in the substrate processing according to the first exemplary embodiment, the etching processing is performed by setting the rotation speed of the substrate to be 30 rpm after the alkaline aqueous solution L is diffused on the entire front surface of the wafer W.

Figure 8:
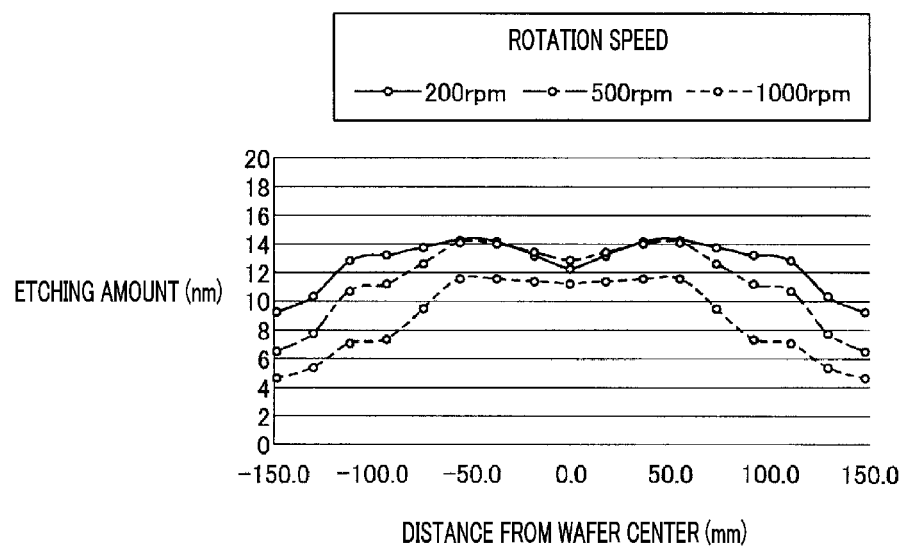
FIG. 8 is a diagram showing a relationship between a wafer rotation speed and an etching amount in the substrate processing according to the first exemplary embodiment.

Here, a relationship between the rotation speed of the wafer W and the etching amount is presented in FIG. 8. FIG. 8 is a diagram showing the relationship between the rotation speed of the wafer W and the etching amount in the substrate processing according to the first exemplary embodiment. FIG. 8 shows etching amounts when the rotation speed of the wafer W is set to be 1000 rpm, 500 rpm and 200 rpm, respectively.

As illustrated in FIG. 8, if the rotation speed of the wafer W is set to be small, a difference in the etching amount with respect to a distance from the center of the wafer W can be reduced. That is, if the rotation speed of the wafer W is set to be small, in-surface uniformity, which is uniformity of the etching amount in a diametrical direction of the wafer W, can be improved.

As stated above, the substrate processing method according to the first exemplary embodiment includes a forming process and a processing process. In the forming process, by supplying the alkaline aqueous solution L having the reduced oxygen concentration (the example of the alkaline processing liquid) onto the wafer W (the example of the substrate), the liquid film of the alkaline aqueous solution L is formed on the wafer W. In the processing process, by rotating the wafer W while supplying the alkaline aqueous solution L in the state that the liquid film having the preset thickness (given thickness) is formed on the wafer W, the wafer W is etched. To elaborate, the oxygen concentration of the alkaline aqueous solution L is equal to or less than 0.1 ppm.

Accordingly, formation of the oxide film F near the opening portion of the hole H of the wafer W can be suppressed. Therefore, the difference in the etching amount in the depth direction of the hole H of the wafer W can be reduced, so that the uniformity of the etching amount in the depth direction of the hole H can be improved.

Further, in the forming process, the wafer W is rotated at a first rotation speed. Further, in the processing process, the wafer W is rotated at a second rotation speed smaller than the first rotation speed.

Accordingly, the liquid film of the alkaline aqueous solution L can be rapidly formed on the entire wafer W, and arrival of the oxygen at the inside of the hole H can be suppressed. Furthermore, since the liquid film of the alkaline aqueous solution L having the preset thickness or larger can be formed on the wafer W, formation of the oxide film F near the opening portion of the hole H of the wafer W can be suppressed. Therefore, the difference in the etching amount in the depth direction of the hole H of the wafer W can be reduced, so that the uniformity of the etching amount in the depth direction of the hole H can be improved. Moreover, by rotating the wafer W at the second rotation speed, formation of ripples on a liquid surface of the alkaline aqueous solution L is suppressed, so that entrance of the oxygen into the alkaline aqueous solution L can be suppressed.

Furthermore, the substrate processing method includes a dissolving process. In the dissolving process, the inert gas is dissolved in the alkaline aqueous solution L.

Accordingly, the oxygen concentration of the alkaline aqueous solution L supplied to the wafer W can be reduced. Therefore, the difference in the etching amount in the depth direction of the hole H of the wafer W is reduced, so that the uniformity of the etching amount in the depth direction of the hole H can be improved.

In addition, the substrate processing apparatus includes a replacing process. In the replacing process, the alkaline aqueous solution L of the wafer W after being subjected to the etching processing is replaced by the DIW (an example of a rinse liquid). Accordingly, the etching processing of the wafer W can be ended.

Further, the processing station 3 (the example of the substrate processing apparatus) includes the dissolving unit 70 and the processing unit 16 (the example of the processing unit). The dissolving unit 70 mixes the inert gas into the alkaline aqueous solution L (the example of the alkaline processing liquid).

Accordingly, in the processing unit 16, formation of the oxide film F near the opening portion of the hole H of the wafer W can be suppressed. Therefore, in the processing unit 16, the difference in the etching amount in the depth direction of the hole H of the wafer W can be reduced, so that the uniformity of the etching amount in the depth direction of the hole H can be bettered.

Second Exemplary Embodiment

Now, a substrate processing system 1 according to a second exemplary embodiment will be described. Here, distinctive features from the substrate processing system 1 of the first exemplary embodiment will be elaborated. The same parts as those of the substrate processing system 1 of the first exemplary embodiment will be assigned same reference numerals, and redundant description thereof will be omitted.

<Processing Unit>

Figure 9:
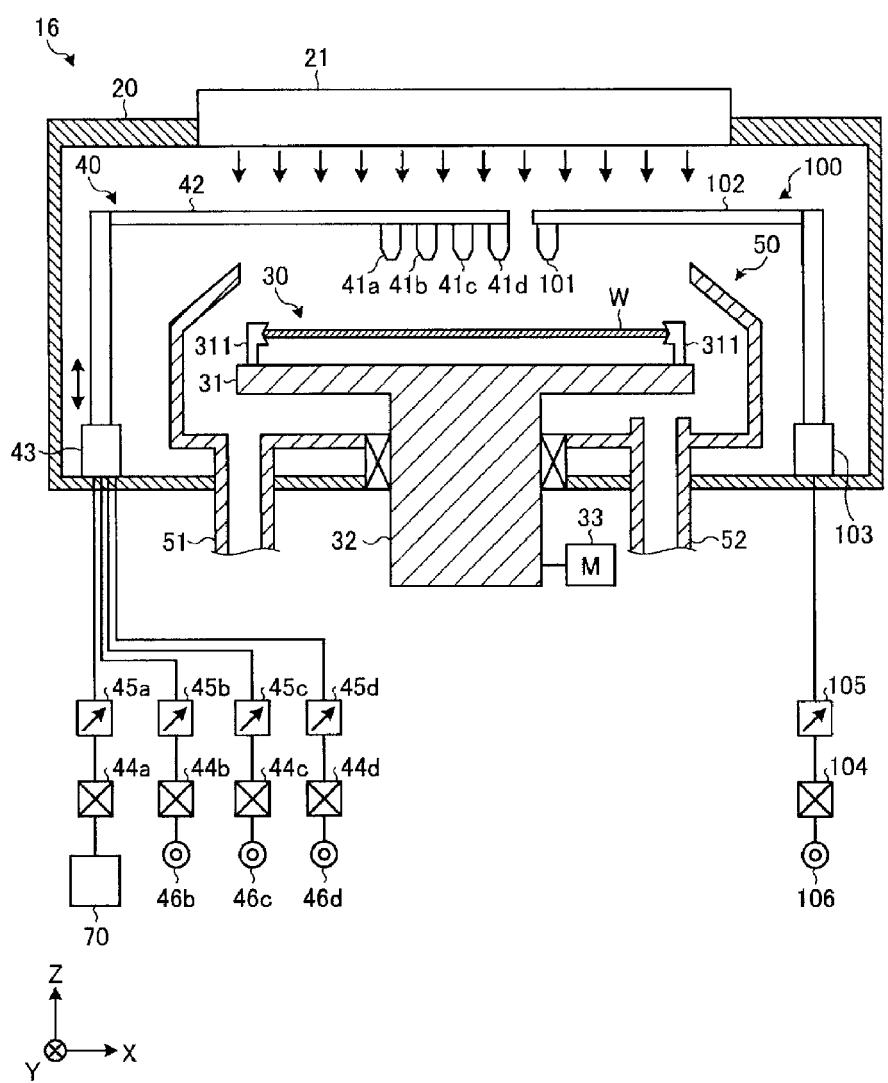
FIG. 9 is a schematic diagram illustrating a configuration of a processing unit according to a second exemplary embodiment.

A processing unit 16 according to the second exemplary embodiment includes a discharging unit 100 configured to discharge an inert gas toward a wafer W (an example of a substrate), as depicted in FIG. 9. FIG. 9 is a schematic diagram illustrating a configuration of the processing unit 16 according to the second exemplary embodiment. The inert gas is nitrogen.

The discharging unit 100 is equipped with a nozzle 101; an arm 102 supporting the nozzle 101; and a rotating mechanism 103 configured to rotate the arm 102. Further, the rotating mechanism 103 may also move the arm 102 up and down.

The nozzle 101 is connected with an inert gas source 106 via a valve 104 and a flow rate controller 105. The nozzle 101 discharges the inert gas toward the wafer W. Further, the inert gas source 106 may be the same as the inert gas source 78 (see FIG. 2) which supplies the inert gas into the bubbling line 75 (see FIG. 2). That is, the inert gas supplied to the alkaline aqueous solution L and the inert gas discharged to the wafer W by the nozzle 101 may be supplied from the one and the same gas source.

<Substrate Processing>

Now, a substrate processing according to the second exemplary embodiment will be explained. An overall sequence of the substrate processing of the second exemplary embodiment is the same as that of the substrate processing according to the first exemplary embodiment shown in FIG. 5.

In an etching processing (FIG. 5, S203), when diffusing the alkaline aqueous solution L onto the entire front surface of the wafer W, a control device 4 supplies the alkaline aqueous solution L while discharging the inert gas from the discharging unit 100. By way of example, after discharging the inert gas onto the front surface of the wafer W from the discharging unit 100, the control device 4 supplies the alkaline aqueous solution L from the nozzle 41a, thus allowing the alkaline aqueous solution L to be diffused onto the entire front surface of the wafer W.

As the inert gas is discharged toward the wafer W from the discharging unit 100, a layer of the inert gas is formed on the front surface of the wafer W. Therefore, the amount of oxygen dissolved in a liquid film of the alkaline aqueous solution L formed on the front surface of the wafer W is reduced.

Further, the discharge of the inert gas onto the front surface of the wafer W from the discharging unit 100 may be performed throughout the entire etching processing. The control device 4 may also discharge the inert gas toward the wafer W from the discharging unit 100 when supplying the alkaline aqueous solution L onto the front surface of the wafer W from the nozzle 41a at a first predetermined flow rate. The control device 4 supplies the inert gas toward the wafer W (an example of the substrate) at least before the forming of the liquid film of the alkaline aqueous solution L on the wafer W.

The substrate processing method according to the second exemplary embodiment includes, at least prior to a forming process, a gas supplying process of supplying the inert gas toward the wafer W (the example of the substrate).

Accordingly, dissolving of oxygen in the liquid film of the alkaline aqueous solution L formed on the front surface of the wafer W can be suppressed, and formation of an oxide film F near an opening portion of a hole H of the wafer W can be suppressed. Therefore, a difference in an etching amount in a depth direction of the hole H of the wafer W can be reduced, so that uniformity of the etching amount in the depth direction of the hole H can be improved.

Third Exemplary Embodiment

Now, a substrate processing system 1 according to a third exemplary embodiment will be described. Here, distinctive features from the substrate processing system 1 of the first exemplary embodiment will be elaborated. The same parts as those of the substrate processing system 1 of the first exemplary embodiment will be assigned same reference numerals, and redundant description thereof will be omitted.

<Processing Unit>

Figure 10:
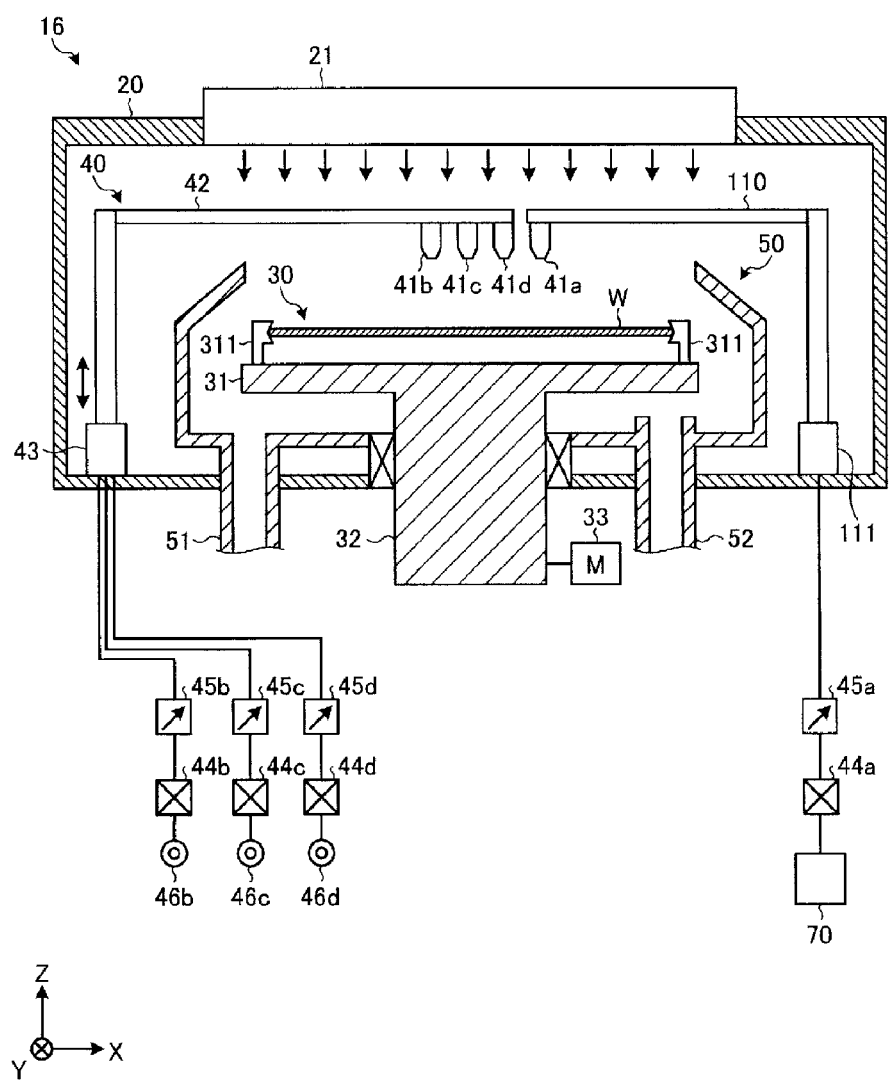
FIG. 10 is a schematic diagram illustrating a configuration of a processing unit according to a third exemplary embodiment.

In a processing unit 16 according to the third exemplary embodiment, a nozzle 41a configured to discharge the alkaline aqueous solution L is supported by an arm 110, as illustrated in FIG. 10. FIG. 10 is a schematic diagram illustrating a configuration of the processing unit 16 according to the third exemplary embodiment.

The arm 110 is rotated and moved up and down by a rotating/elevating mechanism 111. That is, in the processing unit 16, the nozzle 41a which discharges the alkaline aqueous solution L is supported by the arm 110 which is separate from an arm 42 supporting a nozzle 41b configured to discharge DIW and a nozzle 41c configured to discharge DHF.

<Substrate Processing>

Now, an etching processing according to the third exemplary embodiment will be explained. An overall sequence of the substrate processing of the third exemplary embodiment is the same as that of the substrate processing according to the first exemplary embodiment shown in FIG. 5.

In an etching processing (FIG. 5, S203), a control device 4 places the nozzle 41a at a position above a peripheral portion of a wafer W, and supplies the alkaline aqueous solution L to the peripheral portion of the wafer W, thus allowing the peripheral portion of the wafer W to be etched by the alkaline aqueous solution L. Further, the control device 4 places the nozzle 41b at a position above a central portion of the wafer W, and supplies the DIW onto the central portion of the wafer W.

That is, the control device 4 supplies the alkaline aqueous solution L to the peripheral portion of the wafer W while supplying the DIW to the central portion of the wafer W. Further, the control device 4 supplies the DIW and the alkaline aqueous solution L onto the wafer W while rotating the wafer W at a second predetermined rotation speed. The second predetermine rotation speed is set to be smaller than 500 rpm as stated above, for example, equal to or less than 200 rpm. Further, the control device 4 performs the supply of the DIW and the alkaline aqueous solution L for a preset time period. The preset time period is a previously set time and may be, e.g., 120 seconds.

Thereafter, the control device 4 stops the supply of the alkaline aqueous solution L while carrying on the supply of the DIW. Accordingly, the alkaline aqueous solution L on the peripheral portion of the wafer W is replaced by the DIW.

If the replacement by the DIW is ended, the control device 4 stops the supply of the DIW, and places the nozzle 41a at the position above the central portion of the wafer W. Then, the control device 4 supplies the alkaline aqueous solution L onto a front surface of the wafer W from the nozzle 41a, thus allowing the DIW to be replaced by the alkaline aqueous solution L and allowing the alkaline aqueous solution L to be diffused onto the entire front surface of the wafer W. That is, the processing unit 16 (an example of a processing unit) supplies the alkaline aqueous solution L (an example of an alkaline processing liquid) onto the peripheral portion of the wafer W (an example of a substrate), and, after stopping the supply of the alkaline aqueous solution L onto the peripheral portion, the processing unit 16 supplies the alkaline aqueous solution L onto the central portion of the wafer W.

Then, the control device 4 rotates the wafer W at a second predetermined rotation speed while supplying the alkaline aqueous solution L onto the front surface of the wafer W from the nozzle 41a at a first predetermined flow rate, as in the first exemplary embodiment. The second predetermined rotation speed is set to be smaller than, e.g., 500 rpm, the same as in the first exemplary embodiment. The second predetermined rotation speed is set to be, e.g., larger than 0 rpm and equal to or less than 30 rpm.

In a forming process of a substrate processing method according to the third exemplary embodiment, the alkaline aqueous solution L (the example of the alkaline processing liquid) is supplied onto the peripheral portion of the wafer W (the example of the substrate), and, after the supply of the alkaline aqueous solution L to the peripheral portion is stopped, the alkaline aqueous solution L is supplied to the central portion of the wafer W. Accordingly, before the alkaline aqueous solution L is supplied toward the central portion of the wafer W, the peripheral portion of the wafer W is etched previously. Therefore, when performing the etching processing by supplying the alkaline aqueous solution L to the central portion of the wafer W, in-surface uniformity of the wafer W can be improved.

Fourth Exemplary Embodiment

Now, a substrate processing system 1 according to a fourth exemplary embodiment will be described. Here, distinctive features from the substrate processing system 1 of the first exemplary embodiment will be elaborated. The same parts as those of the substrate processing system 1 of the first exemplary embodiment will be assigned same reference numerals, and redundant description thereof will be omitted.

<Processing Unit>

Figure 11:
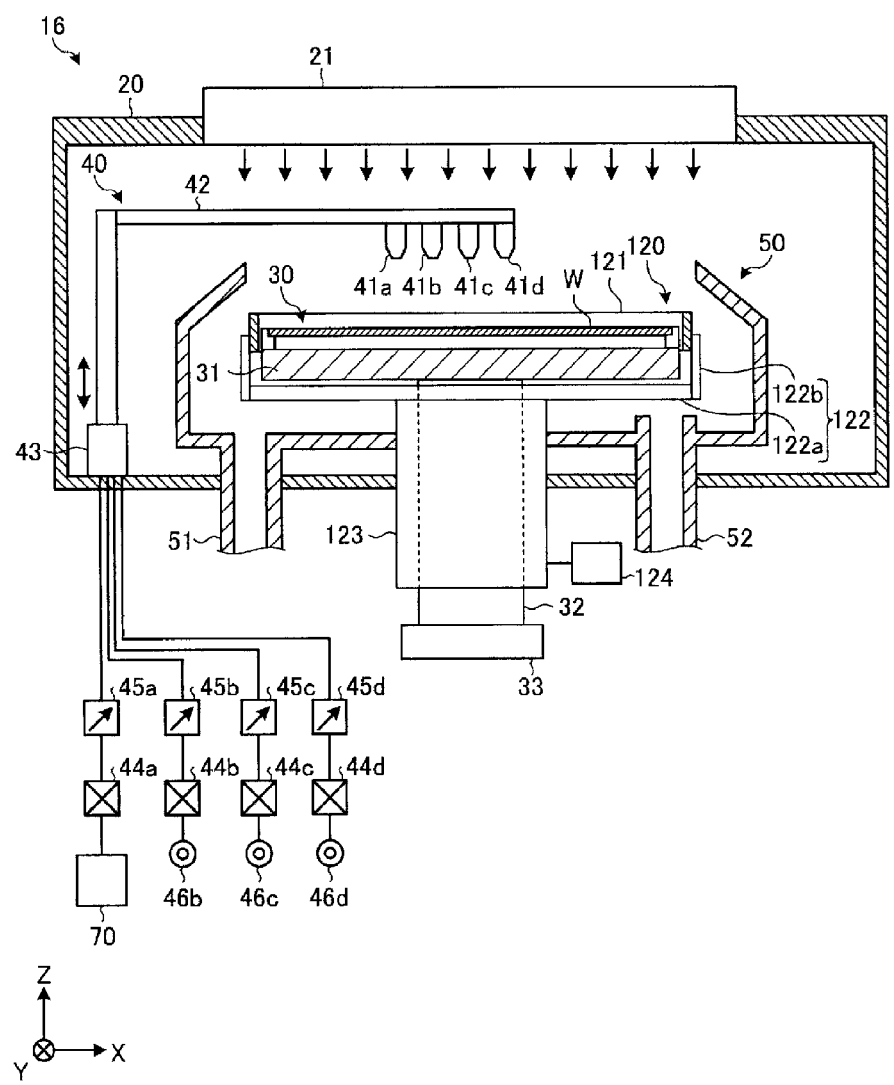
FIG. 11 is a schematic diagram illustrating a configuration of a processing unit according to a fourth exemplary embodiment.

A processing unit 16 according to the fourth exemplary embodiment is equipped with an embankment mechanism 120 as shown in FIG. 11. FIG. 11 is a schematic diagram illustrating a configuration of the processing unit 16 according to the fourth exemplary embodiment. The embankment mechanism 120 includes an embankment member 121, a support 122, a supporting column 123, and a moving mechanism 124.

The embankment member 121 is formed to have a cylindrical shape. The embankment member 121 is disposed within a recovery cup 50. Further, the embankment member 121 is disposed at an outer periphery of a holder 31. That is, the embankment member 121 surrounds an outer periphery of the wafer W held by the holder 31. The embankment member 121 suppresses an outflow of the alkaline aqueous solution L supplied on a wafer W. That is, the embankment member 121 suppresses an outflow of the alkaline aqueous solution L from the wafer W. Further, to suppress interference between the embankment member 121 and the holder 31, a gap is provided between the embankment member 121 and the holder 31.

The support 122 supports the embankment member 121. The support 122 includes a horizontally extending first supporting member 122a; and a vertically extending second supporting member 122b which connects the embankment member 121 and the first supporting member 122a.

The supporting column 123 is vertically extended and connected to the first supporting member 122a. The supporting column 123 supports the support 122 and the embankment member 121. The supporting column 123 is formed to have a cylindrical shape, and a supporting column 32 of a substrate holding mechanism 30 is inserted therein.

The moving mechanism 124 moves the supporting column 123 vertically. That is, the moving mechanism 124 moves the support 122 and the embankment member 121 vertically via the supporting column 123. To elaborate, the moving mechanism 124 moves the embankment member 121 between a retreat position and a blocking position. The retreat position is a position where an upper end surface of the embankment member 121 becomes lower than a top surface of the wafer W. Further, the blocking position is a position where the upper end surface of the embankment member 121 becomes higher than the top surface of the wafer W. By way of example, the blocking position is a position where the upper end surface of the embankment member 121 becomes higher than the top surface of the wafer W as much as a preset thickness.

When an etching processing is performed, the embankment member 121 of the embankment mechanism 120 is placed at the blocking position and confines the alkaline aqueous solution L on the wafer W.

As stated above, the processing unit 16 (an example of a processing unit) supplies the alkaline aqueous solution (an example of an alkaline processing liquid) L including the inert gas onto the wafer W (an example of a substrate) in the state that the wafer W is surrounded by the embankment member 121.

<Substrate Processing>

Now, a substrate processing according to the fourth exemplary embodiment will be explained. An overall sequence of the substrate processing according to the fourth exemplary embodiment is the same as that of the substrate processing according to the first exemplary embodiment.

In an etching processing (FIG. 5, S203), a control device 4 moves the embankment member 121 of the embankment mechanism 120 to the blocking position from the retreat position, and supplies the alkaline aqueous solution L onto the wafer W.

The alkaline aqueous solution L is blocked by the embankment member 121 and forms a liquid film having a preset film thickness or larger on a front surface of the wafer W. At this time, a part of the alkaline aqueous solution L leaks down from the gap provided between the embankment member 121 and the holder 31. Since, however, a flow rate of the alkaline aqueous solution L supplied from a nozzle 41a is larger than a flow rate of the alkaline aqueous solution L leaking from the gap, the liquid film equal to or larger than the preset thickness is formed on the front surface of the wafer W.

The control device 4 rotates the wafer W at a second predetermined rotation speed while supplying the alkaline aqueous solution L from the nozzle 41a at a first predetermined flow rate. Further, the control device 4 supplies the alkaline aqueous solution L from the nozzle 41a while rotating an arm 42 supporting the nozzle 41a.

As stated above, by supplying the alkaline aqueous solution L, the etching processing is performed in the state that the thickness of the liquid film of the alkaline aqueous solution L formed on the wafer W is maintained equal to or larger than the preset thickness. Since the alkaline aqueous solution L is blocked by the embankment member 121 and supplied from the nozzle 41a, it is overflown from the embankment member 121.

In a processing process of a substrate processing method according to the fourth exemplary embodiment, the alkaline aqueous solution L (the example of the alkaline processing liquid) is supplied in the state that the wafer W (the example of the substrate) is surrounded by the embankment member 121.

Accordingly, while maintaining the thickness of the liquid film of the alkaline aqueous solution L equal to or larger than the preset thickness by the embankment member 121, the alkaline aqueous solution L existing near a liquid surface of the liquid film of the alkaline aqueous solution L and including oxygen can be overflown from the embankment member 121. Therefore, formation of an oxide film F near the opening portion of the hole H of the wafer W can be suppressed. Further, since a difference in the etching amount in the depth direction of the hole H of the wafer W can be reduced, uniformity of the etching amount in the depth direction of the hole H can be improved.

Modification Example

In an etching processing, a substrate processing system 1 according to a modification example changes a flow rate of the alkaline aqueous solution L supplied to the wafer W after diffusing the alkaline aqueous solution L onto the entire front surface of the wafer W.

To elaborate, in an etching processing, a control device 4 according to the modification example varies the flow rate of the alkaline aqueous solution L supplied to the front surface of the wafer W from a nozzle 41*a* between first preset flow rate and a second preset flow rate while rotating the wafer W at a first predetermined rotation speed. The second flow rate is a previously set flow rate and is lower than the first preset flow rate. By way of non-limiting example, the second preset flow rate is 0.5 L/min. The control device 4 according to the modification example switches the flow rate of the alkaline aqueous solution L between the first preset flow rate and the second preset flow rate multiple times until the etching processing is ended.

Further, the flow rate may be switched between three different levels of flow rates. Furthermore, the flow rate is changed continuously.

As stated above, in a processing process according to the modification example, the flow rate (an example of a supply flow rate) of the alkaline aqueous solution L (an example of an alkaline processing liquid) is changed. Accordingly, fluidity of the alkaline aqueous solution in the hole H of the wafer W can be improved, and replaceability of the alkaline aqueous solution in the hole H of the wafer W can be improved. Therefore, etching of the wafer W can be carried out rapidly.

The technical features of the substrate processing systems 1 according to the above-described exemplary embodiments and modification example may be combined. By way of example, the substrate processing system 1 may supply the inert gas to the wafer W by the discharging unit 100 while blocking the alkaline aqueous solution L by the embankment member 121. Further, the substrate processing system 1 may supply the inert gas to the wafer W from the discharging unit 100, and vary the flow rate of the alkaline aqueous solution L supplied from the nozzle 41*a*.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims.

According to the exemplary embodiment, it is possible to improve the uniformity of the etching amount in the depth direction of the hole formed in the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

I claim:

1. A substrate processing apparatus, comprising:
    a dissolving unit configured to dissolve an inert gas in an alkaline processing liquid; and
    a processing unit configured to perform an etching processing on a substrate by rotating the substrate while supplying the alkaline processing liquid including the inert gas onto the substrate,
    wherein the processing unit is further configured to form a liquid film of the alkaline processing liquid on the substrate by supplying the alkaline processing liquid onto the substrate, and
    the processing unit is further configured to supply the alkaline processing liquid including the inert gas onto a peripheral portion of the substrate, and, after supplying of the alkaline processing liquid including the inert gas onto a peripheral portion of the substrate is stopped, supply the alkaline processing liquid including the inert gas onto a central portion of the substrate,
    wherein in the etching processing, a thickness of the liquid film is maintained equal to or larger than a preset thickness so that adhesion of oxygen to the substrate is suppressed.

2. The substrate processing apparatus of claim 1, further comprising:
    a discharging unit configured to discharge the inert gas toward the substrate.

3. The substrate processing apparatus of claim 1,
    wherein the processing unit includes an embankment member surrounding the substrate, and
    the processing unit is further configured to supply the alkaline processing liquid including the inert gas onto the substrate in a state that the substrate is surrounded by the embankment member.

* * * * *

UNITED STATES PATENT AND TRADEMARK OFFICE
CERTIFICATE OF CORRECTION

PATENT NO. : 11,735,428 B2
APPLICATION NO. : 17/813983
DATED : August 22, 2023
INVENTOR(S) : Shoichiro Hidaka Page 1 of 1

It is certified that error appears in the above-identified patent and that said Letters Patent is hereby corrected as shown below:

In the Specification

Column 9, Line 21, "Las the inert gas." should be -- L as the inert gas. --.

Column 14, Line 13, "wafer Was much" should be -- wafer W as much --.

Signed and Sealed this
Thirtieth Day of April, 2024

Katherine Kelly Vidal
*Director of the United States Patent and Trademark Office*